United States Patent [19]

Beerlage

[11] Patent Number: 4,746,619
[45] Date of Patent: May 24, 1988

[54] METHOD OF MANUFACTURING AN IMAGE DETECTION DEVICE FOR RADIOGRAPHIC PURPOSES

[75] Inventor: Meindert J. M. Beerlage, Pijnacker, Netherlands

[73] Assignee: B.V.Optische Industrie"De Oude Delft", Delft, Netherlands

[21] Appl. No.: 79,084

[22] Filed: Jul. 27, 1987

[30] Foreign Application Priority Data

Aug. 7, 1986 [NL] Netherlands ......................... 8602021

[51] Int. Cl.$^4$ ..................... H01L 31/18; H01L 27/14
[52] U.S. Cl. ....................................... 437/3; 437/241; 357/30
[58] Field of Search ......................................... 437/2–5, 437/51, 241; 357/30 H

[56] References Cited

U.S. PATENT DOCUMENTS

| | | | |
|---|---|---|---|
| 4,197,633 | 4/1980 | Lorenze, Jr. et al. | 437/3 |
| 4,290,844 | 9/1981 | Rotolante et al. | 156/630 |
| 4,411,059 | 10/1983 | Schlosser et al. | 437/3 |
| 4,618,380 | 10/1986 | Alcorn et al. | 437/3 |
| 4,686,761 | 8/1987 | Hacskaylo | 437/5 |

Primary Examiner—Aaron Weisstuch
Attorney, Agent, or Firm—Louis E. Marn

[57] ABSTRACT

In manufacturing an image detection device for radiographic purposes a matrix consisting of rows and columns of image-recording elements is formed in a substrate of semiconductor material. A protective layer of e.g. $SiO_2$ or $Si_3N_4$ is applied to the surface of the matrix of image recording elements. The layer is provided with grooves. The grooves extend between the rows and columns of image-recording elements. The depth of the grooves is at most equal to the thickness of the protective layer. Subsequently a layer of CsI is applied by vapor deposition on the upper side of the protective layer.

3 Claims, No Drawings

METHOD OF MANUFACTURING AN IMAGE DETECTION DEVICE FOR RADIOGRAPHIC PURPOSES

The invention relates to a method for the manufacture of an image-recording device, in which at least a matrix consisting of rows and columns of image-recording elements is formed in a substrate of semi-conductor material.

In radiography, it is known from U.S. Pat. No. 4,179,100 to direct a flat fan-shaped beam of X-ray radiation via a body to be examined to an image-recording device consisting of a large number of image-recording elements located in a line. In this process each image-recording element receives the radiation, which may or may not have been processed further, which has been transmitted through a corresponding part of the body to be examined. As further processing, the radiation may, for example, be converted into visible light in an X-ray detector before it is received by the image-recording device.

In an image-recording device consisting of a large number of image-recording elements located in a line and having dimensions of, for example, $0.1 \times 0.1$ mm$^2$, the exposure time for each image-recording element is extremely short for the usual scanning speeds of a body to be examined. As a result the signal/noise ratio of the image obtained is very poor or the source load has to be increased to undesirably high levels to obtain a better signal/noise ratio. In order to obtain an acceptable signal/noise ratio with a relatively low source load it is necessary to use the X-ray source more efficiently than is possible with a fan-shaped beam having a thickness no greater than one image-recording element.

It is known from U.S. Pat. No. 4,383,327 to use an image-recording device comprising a matrix having rows and columns of image-recording elements, in which the charge which is produced during a given period in a given image-recording element as a result Of the radiation received by said element during said period, is transferred during a read period to an adjacent associated vertical shift register. This takes place during the read period for all the image-recording elements in each row. At the same time, between the successive periods a relative movement is brought about between the body and the image-recording device so that during the next period the same part of the body to be examined, that is to say the same row of image points of the body to be examined, is imaged on the next row of image-recording elements. It is also possible in a manner known per se to combine the function of converting radiation into a charge and the function of transporting a charge in a vertical CCD shift register.

The charge in the shift register is carried along so that in this manner a charge is accumulated in the associated shift register during successive periods by successive image-recording elements in a column. The accumulated charge is the sum of the charge which is transmitted through a specific part (an image point) of the body to be examined during the successive periods. A horizontal shift register may be mounted on one end of the columns for successively reading out and delivering in sequence the information of the adjacent columns to an output terminal. The information thus always represents the sum of the information from all the image-recording elements in each of the columns for an image point.

This method for scanning is termed TDI (Time Delay and Integration) and is found to be of particularly good applicability in the examination of bodies by means of X-ray radiation, it being possible for a usable image to be formed despite the fact that each image-recording element per se generates only a very small amount of charge in response to the radiation received. For a comprehensive discussion of the TDI principle reference is made to U.S. Pat. No. 4,383,327.

For converting the incident X-ray radiation on the image-recording device into visible light which can be detected by the photodiodes and can be converted by these into an electrical signal corresponding to the detected quantity of light and hence with the incident X-ray radiation, use can be made in a manner known per se of CsI which is applied by vapour deposition in a layer on the surface of the image-recording device, on the matrix of the image-recording elements. Because X-ray radiation has an adverse effect on the properties of semi-conductors, i.e. the photodiodes, the layer of CsI is preferably given as large a thickness as possible in order to minimize the X-ray radiation passing through to the photodiodes. This has the further advantage that as much radiation as possible is absorbed in the CsI, which radiation thus contributes to the signal. A thick layer of CsI has the result, however, that a high degree of diffusion of the visible light formed occurs in this layer as a consequence of which the MTF (modulation transfer function) and hence also the quality of the detected X-ray image deteriorate considerably.

The object of the invention is to provide a solution to the above problem for which purpose a protective layer is provided, according to the invention, on the surface of the image-recording device, in which layer grooves are subsequently provided with a depth which is at most equal to the thickness of the layer, which grooves extend between the rows and columns of the image-recording elements, after which a layer of CsI is applied by vapour deposition on the surface of the protective layer. The grooves can be provided in a manner known per se by means of known techniques such as plasma-etching, photo-etching, ion-etching, etc.

By applying the scratch layer on the surface of the image-recording device and providing grooves in this layer, essentially an island of material of the protective layer is formed above each photodiode of the image-recording equipment. When the CsI is subsequently applied by vapour deposition the CsI crystals surprisingly appear to form via the island, the crystals on adjacent islands possessing different crystal orientations. As the vapour-deposition process continues and the CsI layer becomes thicker, the CsI layers on adjacent islands in fact appear to grow relative to each other because with increasing thickness the dimensions also increase parallel to the surface of the image-recording device but without growing into each other because of the different crystal orientations of the CsI on adjacent islands.

At the end of the vapour-deposition process and after testing the image-recording device manufactured in the above-mentioned manner there is only a minimum interchange of light between the parts of the CsI layer on adjacent islands of the protective layer with the result that the MTF of the image-recording equipment is considerably improved.

Suitable materials for the protective layer are, for example, $SiO_2$, $Si_3N_4$, or a mixture of $SiO_2$ and $Si_3N_4$, which is known by the name of silicium oxide nitride.

$Si_3N_4$ is preferred because it has a refractive index which is very close to the refractive index of CsI so that the transfer of light from the CsI to the photodiode underneath is optimum.

For the grooves introduced into the protective layer a width of 10 to 20 micrometers and a depth of likewise 10 to 20 micrometers appears very suitable for obtaining the desired effect of different crystal orientations of the CsI which is applied by vapour deposition on the adjacent islands in the protective layer.

Although for TDI applications use will be made of a matrix image-recording element consisting of a number of rows and a number of columns it is also possible for other radiographic applications, in particular when a high source load is no disadvantage, to use the matrix consisting of only one row of image-recording elements located next to each other, each image-recording element forming a "column". The advantages of the method according to the invention with such a matrix consisting of one row are the same as those with a matrix consisting of several rows.

I claim:

1. Method for the manufacture of an image-recording device in which at least a matrix consisting of rows and columns of image-recording elements is formed in a substrate of semi-conductor material, characterized in that a protective layer is applied to the surface of the matrix of image-recording elements, after which grooves are provided in this layer with a depth which is at most equal to the thickness of the protective layer which grooves extend between the rows and columns of image-recording elements, and in that subsequently a layer of CsI is applied by vapor deposition on the upper side of the protective layer.

2. Method according to claim 1, characterized in that the material for the protective layer is $Si_3N_4$.

3. Method according to claim 1 or 2, characterized in that the grooves have a width and a depth of 10 to 20 micrometers.

* * * * *